(12) United States Patent
Shibata et al.

(10) Patent No.: US 6,713,789 B1
(45) Date of Patent: Mar. 30, 2004

(54) GROUP III NITRIDE COMPOUND SEMICONDUCTOR DEVICE AND METHOD OF PRODUCING THE SAME

(75) Inventors: Naoki Shibata, Bisai; Jun Ito, Inazawa; Toshiaki Chiyo, Ama-gun; Shizuyo Asami, Inazawa; Hiroshi Watanabe, Ichinomiya; Masanobu Senda, Niwa-gun; Shinya Asami, Inazawa, all of (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 09/516,177

(22) Filed: Mar. 1, 2000

(30) Foreign Application Priority Data

Mar. 31, 1999 (JP) .............................. 11-130475
Sep. 21, 1999 (JP) .............................. 11-266499

(51) Int. Cl.[7] .......................... H01L 33/00; H01L 29/06
(52) U.S. Cl. ....................................... 257/103; 257/13
(58) Field of Search ............................. 257/13, 82, 85, 257/103

(56) References Cited

U.S. PATENT DOCUMENTS

| | | | |
|---|---|---|---|
| 4,153,905 A | * 5/1979 | Charmakadze et al. | 357/16 |
| 4,855,249 A | 8/1989 | Akasaki et al. | |
| 5,122,845 A | 6/1992 | Manabe et al. | 357/17 |
| 5,237,182 A | * 8/1993 | Kitagawa et al. | 257/15 |
| 5,278,433 A | * 1/1994 | Manabe et al. | 257/103 |
| 5,633,192 A | 5/1997 | Moustakas et al. | |
| 6,307,219 B1 | * 10/2001 | Oku et al. | |
| 6,501,154 B2 | * 12/2002 | Morita et al. | |

FOREIGN PATENT DOCUMENTS

| | | | |
|---|---|---|---|
| JP | 60-173829 | * | 9/1985 |
| JP | 05-063236 | | 3/1993 |
| JP | 5-86646 | | 12/1993 |

OTHER PUBLICATIONS

Uchida et al, "Characterization of Nitridated Layers and Their Effect on the Growth and Quality of GaN", Solid-State Electronics, Vol. 41, No. 2, (1997), pp. 135–139.
Patent Abstracts of Japan 60–173829 dated Sep. 7, 1985.
Chinese Office Action dated May 9, 2003 with translation.
K. Uchida, et al., "Characterization of Nitridated Layers and Their Effect on the Growth and Quality of GaN", Solid-State Electronics, Vol. 41, No. 2, Feb. 1, 1997, pp. 135–139.

* cited by examiner

Primary Examiner—Roy Potter
(74) Attorney, Agent, or Firm—McGinn & Gibb, PLLC

(57) ABSTRACT

A first group III nitride compound layer, which is formed on a substrate by a method not using metal organic compounds as raw materials, is heated in an atmosphere of a mixture gas containing a hydrogen or nitrogen gas and an ammonia gas, so that the crystallinity of a second group III nitride compound semiconductor layer formed on the first group III nitride compound layer is improved. When the first group III nitride compound layer is formed on a substrate by a sputtering method, the thickness of the first group III nitride compound layer is set to be in a range of from 50 Å to 3000 Å.

37 Claims, 12 Drawing Sheets

GROUP III NITRIDE COMPOUND SEMICONDUCTOR DEVICE AND METHOD OF PRODUCING THE SAME

BACKGROUND OF THE INVENTION

1. Field of the Invention

The present invention relates to a group III nitride compound semiconductor device and a method of producing the same.

The present application is based on Japanese Patent Applications No. Hei. 11-130475 and 11-266499, which are incorporated herein by reference.

2. Description of the Related Art

A group III nitride compound semiconductor device such as a blue light-emitting device, or the like, was produced by the steps of: growing a buffer layer of $Al_xGa_{1-x}N$ ($0 \leq X \leq 1$) on a sapphire substrate by a metal organic chemical vapor deposition method (abbreviated as "MOCVD method" in this specification); and further growing a group III nitride compound semiconductor layer on the buffer layer by the same MOCVD method.

In the MOCVD method, an ammonia gas and gases of group III metal alkyl compounds such as trimethylaluminum (TMA), trimethylgallium (TMG) and trimethylindium (TMI) are supplied onto a substrate heated to an appropriate temperature and are thermally decomposed so that a film of a desired crystal is formed on the substrate. On this occasion, metal organic compounds such as TMA, and so on, which serve as raw-material gases for forming the buffer layer, are expensive. This was a factor of increasing the cost of the group III nitride compound semiconductor device.

If the buffer layer of $Al_xGa_{1-x}N$ ($0 \leq X \leq 1$) is formed by a method other than the MOCVD method, the use of metal organic compounds such as TMA, TMG, and so on, can be avoided. For example, Japanese Patent Publication No. Hei. 5-86646 has proposed a method in which a buffer layer is formed by a high-frequency sputtering method; group III metal organic compounds are supplied to the buffer layer after the buffer layer is heated (to a temperature of from 800° C. to 1000° C.) in an atmosphere containing an ammonia gas (ammonia and nitrogen in an embodiment); and then the group III metal organic compounds are decomposed on a heated substrate so that a nitride film thereof is vapor-grown and $Al_xGa_{1-x}N$ ($0 \leq X \leq 1$) of the same composition is grown on the buffer layer. Raw materials used for forming the buffer layer of $Al_xGa_{1-x}N$ ($0 \leq X \leq 1$) by the high-frequency sputtering method are high-purity metallic aluminum and metallic gallium. A mixture gas of argon and nitrogen with these metals as targets is used as a sputter gas. In this case, all the raw materials are inexpensive. Hence, the cost of the device can be reduced compared with the case where expensive metal organic compounds are used as raw materials for forming the buffer layer by the MOCVD method.

Although the inventors of the present invention tried the method disclosed in Japanese Patent Publication No. Hei. 5-86646, the crystallinity of the group III nitride compound semiconductor layer which is formed by the MOCVD method so as to be grown on the buffer layer of $Al_xGa_{1-x}N$ ($0 \leq X \leq 1$) formed by the high-frequency sputtering method did not satisfy the inventors' requirements. That is, the crystallinity of the group III nitride compound semiconductor layer obtained in the aforementioned manner was inferior to the crystallinity of the group III nitride compound semiconductor layer which is formed by the MOCVD method so as to be grown on the buffer layer of $Al_xGa_{1-x}N$ ($0 \leq X \leq 1$) formed by the MOCVD method.

SUMMARY OF THE INVENTION

The inventors of the present application have made one examination after another earnestly to improve the crystallinity of the group III nitride compound semiconductor layer. As a result, the inventors have conceived the prevent invention of the present application.

That is, there is provided a group III nitride compound semiconductor device comprising: a substrate; a first group III nitride compound layer which has a thickness of from 50 Å to 3000 Å and which is formed on the substrate by a method not using metal organic compounds as raw materials; and a second group III nitride compound semiconductor layer which is formed on the first group III nitride compound layer.

According to the group III nitride compound semiconductor device configured as described above, the crystallinity of the second group III nitride compound semiconductor layer formed on the first group III nitride compound layer and having a function as the device is improved by an attempt to optimize the thickness of the first group III nitride compound layer which will be a buffer layer.

Incidentally, the thickness of the first group III nitride compound layer is preferably set to be in a range of from 50 Å to 3000 Å. If the layer is thinner than 50 Å, the layer cannot fulfill the function as a buffer layer. According to the inventors' examination, there is a risk of the cracking in the first group III nitride compound layer or the second group III nitride compound semiconductor layer formed on the first group III nitride compound layer if each layer is thicker than 3000 Å. That is, either the layer thinner than 50 Å or the layer thicker than 3000 Å is undesirable.

On the other hand, Japanese Patent Publication No. Hei. 5-86646 has disclosed the use of a buffer layer having a thickness of from 1000 Å to 7000 Å. The fact that the upper limit of the film thickness range is set to be 3000 Å is, however, a novel knowledge which is just acquired now by the inventors and by which the buffer layer or the second group III nitride compound semiconductor layer is prevented from cracking.

The inventors have further made one examination after another earnestly. As a result, they have found that the crystallinity of the second group III nitride compound semiconductor layer formed on the buffer layer is improved when the buffer layer is heated in an atmosphere of a mixture gas containing a hydrogen gas and an ammonia gas in the case where the buffer layer is formed of a group III nitride compound by a DC magnetron sputtering method. Hence, the inventors have conceived the invention.

The configuration of this invention is as follows.

There is provided a method of producing a group III nitride compound semiconductor device, comprising the steps of:

forming a first group III nitride compound semiconductor layer on a substrate by a method not using metal organic compounds as raw materials (step 1);

heating the first group III nitride compound layer in an atmosphere of a mixture gas containing a hydrogen gas and an ammonia gas (step 2); and forming a second group III nitride compound semiconductor layer on the first group III nitride compound semiconductor layer (step 3).

The configuration of this invention is as follows.

The inventors have photographed an RHEED pattern of an AlN layer as an example of the first group III nitride compound layer formed by the steps up to the step 2 in the aforementioned manner and an RHEED pattern of an AlN layer as an example of the first group III nitride compound layer formed without the step 2 in the aforementioned producing method. As a result of comparison between the two patterns, it has been found that the spot intensity of the former is greater than the spot intensity of the latter.

Accordingly, improvement in crystallinity of the first group III nitride compound layer can be confirmed by execution of the step 2 in which the first group III nitride compound layer is heated in an atmosphere of a mixture gas containing a hydrogen gas and an ammonia gas.

Features and advantages of the invention will be evident from the following detailed description of the preferred embodiments described in conjunction with the attached drawings.

DETAILED DESCRIPTION OF THE PREFERRED EMBODIMENTS

Respective elements of the present invention will be described below in detail.

Substrate

The material of a substrate is not limited specifically if a first group III nitride compound layer can be grown on the substrate. For example, sapphire, silicon, silicon carbide, zinc oxide, gallium phosphide, gallium arsenide, magnesium oxide, manganese oxide, group III nitride compound semiconductor single crystal, and so on, can be enumerated as substrate materials.

Of those materials, it is preferable to use a sapphire substrate and it is further preferable to use the face a of a sapphire substrate, $(11\overline{2}0)$.

First Group III Nitride Compound Layer

A group III nitride compound or a group III nitride compound semiconductor is expressed by the general formula $Al_XGa_YIn_{1-X-Y}N$ (0X<1, 0Y1, 0X+Y1), which includes so-called binary compounds such as AlN, GaN and InN, and so-called ternary compounds such as $Al_XGa_{1-X}N$, $Al_XIn_{1-X}N$ and $Ga_XIn_{1-X}N$, (0X1 in each formula). The group III elements may be partially replaced by boron (B), thallium (Tl), etc. Further, the nitrogen (N) may be partially replaced by phosphorus (P), arsenic (As), antimony (Sb), bismuth (Bi), etc.

As methods in which metal organic compounds are not used as raw materials, there are a sputtering method inclusive of a reactive sputtering method (especially, a DC magnetron sputtering method), an evaporation method, an ion plating method, a laser ablation method, and an ECR method. According to such methods, metallic aluminum, metallic gallium, metallic indium, and a nitrogen or ammonia gas are used as raw materials for forming a buffer layer of a first group III nitride compound. Alternatively, the first group III nitride compound may be used as a target in itself. In either case, these raw materials are inexpensive compared with organic aluminum.

Figure 1:
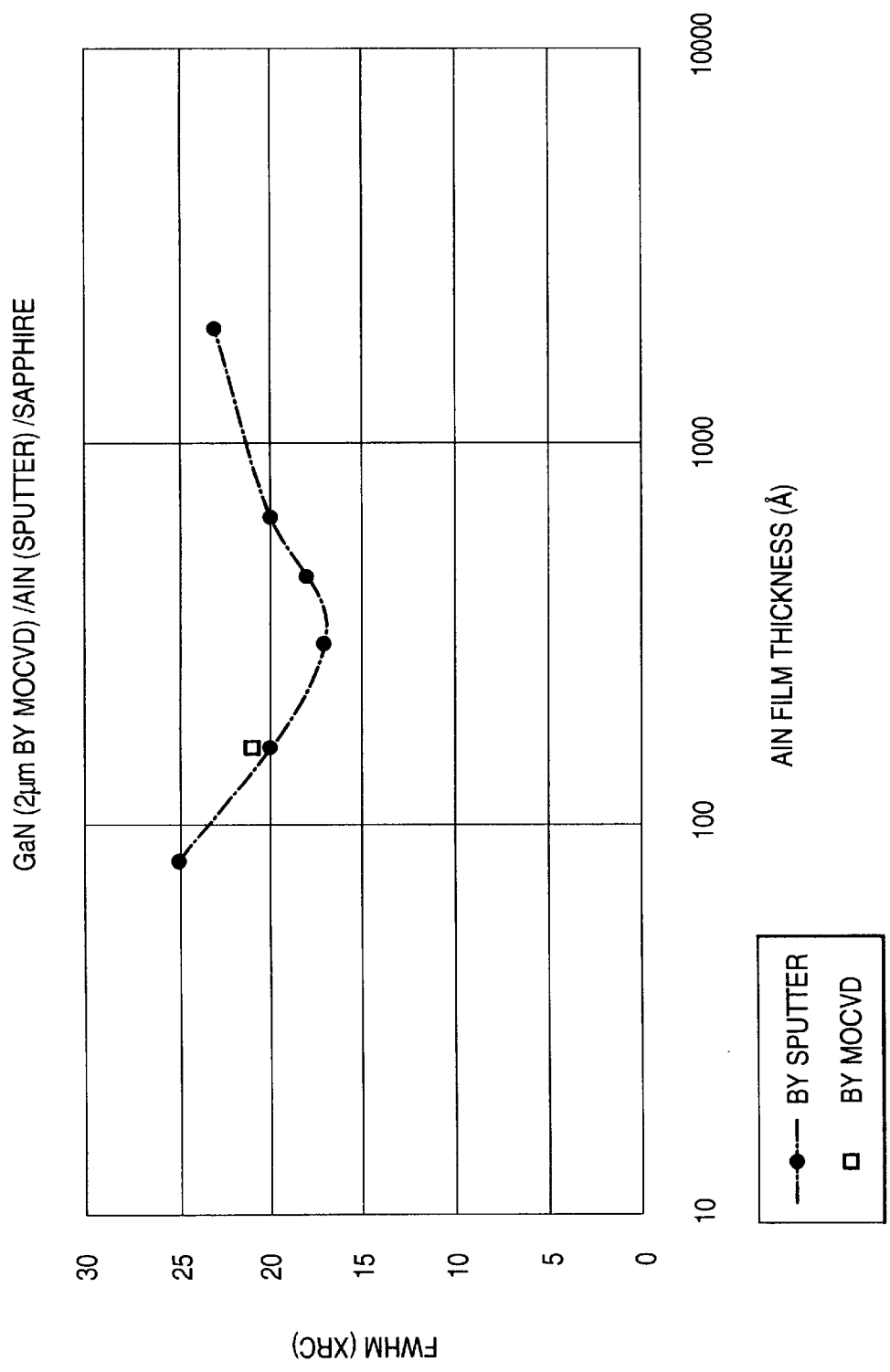
FIG. 1 is a graph showing the relation between the thickness of an AlN film and the crystallinity of a GaN layer.

FIG. 1 shows the relation between the thickness of an AlN film formed by a DC magnetron sputtering method and the crystallinity of a GaN layer (2 $\mu$m) formed on the AlN film by an MOCVD method. In the graph, the vertical axis expresses the half-value width (sec) of an X-ray rocking curve of the GaN layer. In the graph, the symbol □ expresses the half-value width of the X-ray rocking curve of the GaN layer in the case where AlN is formed by an MOCVD method (substrate temperature: 400° C.). It may safely be the that the obtained grade of crystallinity is sufficient for the GaN layer to constitute the function as the device.

Incidentally, measurement conditions in FIG. 1 are as follows.

Substrate: sapphire face a

Temperature of substrate surface for sputtering: 430° C.

Sputter gas: Ar (8 sccm)/$N_2$ (10 sccm)

DC power: 0.5W (in an electrode area of about 182 $cm^2$)

Film thickness: adjusted by sputtering time

It is apparent from the result of FIG. 1 that a GaN layer having a crystallinity equivalent to or more excellent than the crystallinity of a so-called low-temperature buffer layer in the background art is obtained when the thickness of the GaN layer is not smaller than 100 Å but smaller than 1000 Å. Even in the case where the thickness of the GaN layer is out of the aforementioned range, the half-value width of the GaN layer is set to be not larger than 30 sec if the thickness of the GaN layer is not smaller than 50 Å but not larger than 3000 Å so that the GaN layer can be used as a layer for constituting the function as the device.

An AlN or GaN buffer layer formed by a general-purpose buffer layer formation method (low-temperature MOCVD method) has an amorphous or near-amorphous structure when the layer is formed as a film. In a heating-up period in which the buffer layer is heated to the temperature for growth of a second group III nitride compound semiconductor layer to be grown next, AlN or GaN in the buffer layer is recrystallized and becomes polycrystalline just before the second group III nitride compound semiconductor layer is formed as a film. This brings optimum crystal grain size and density for the second group III nitride compound semiconductor layer, so that good single crystal growth can be made. The crystal grain size and density are parameters which are important to the high-quality growth of the second group III nitride compound semiconductor. These parameters are relatively sensitive because the thickness of the buffer layer correlates with these parameters.

It can be thought that, when a so-called low-temperature buffer layer is heated at the same temperature, it tends that the crystallinity of the layer becomes better as the layer becomes thinner. Assuming samples different in thickness, the temperature required for obtaining the same crystallinity becomes higher as the sample becomes thicker. As a result, the thickness of the so-called low-temperature buffer layer should be set at particular optimum value and the thickness is only allowed to be in a narrow range (from 100 Å to 200 Å).

Generally, sputter-emitted particles have kinetic energy of from 5 eV to 10 eV on average. It can be thought that, when a buffer layer, that is, a first group III nitride compound layer is formed by the sputtering method, crystallization occurs even at a lower film-forming temperature compared with the MOCVD method because the kinetic energy promotes migration of particles (atoms) on a substrate.

In comparison between the case where a sample (first group III nitride compound layer) initially crystallized to a certain degree is merely heated and the case where an amorphous sample is merely heated, which of the two samples is better in the crystallinity of a second group III nitride compound semiconductor layer formed thereon cannot be the without reservation. It is, however, apparent from the result of the half-value width of the X-ray rocking curve shown in FIG. 1 that the crystallinity of the second group III nitride compound semiconductor layer formed on the former sample, that is, on the first group III nitride compound layer formed by the sputtering method in FIG. 1 is improved more greatly by optimization of the thickness of the first group III nitride compound layer. The former sample is also better in a relatively wide thickness range.

FIG. 1 shows a result in the case where AlN as a first layer is sputtered onto a sapphire face a and then a GaN layer as a second layer is formed thereon by the MOCVD method. It can be thought that this result can be obtained regardless of the material for the substrate, the material (group III nitride compound) and method (not using metal organic compounds as raw materials) for producing the first layer and the material and method for producing the second layer (group III nitride compound semiconductor).

Figure 2:
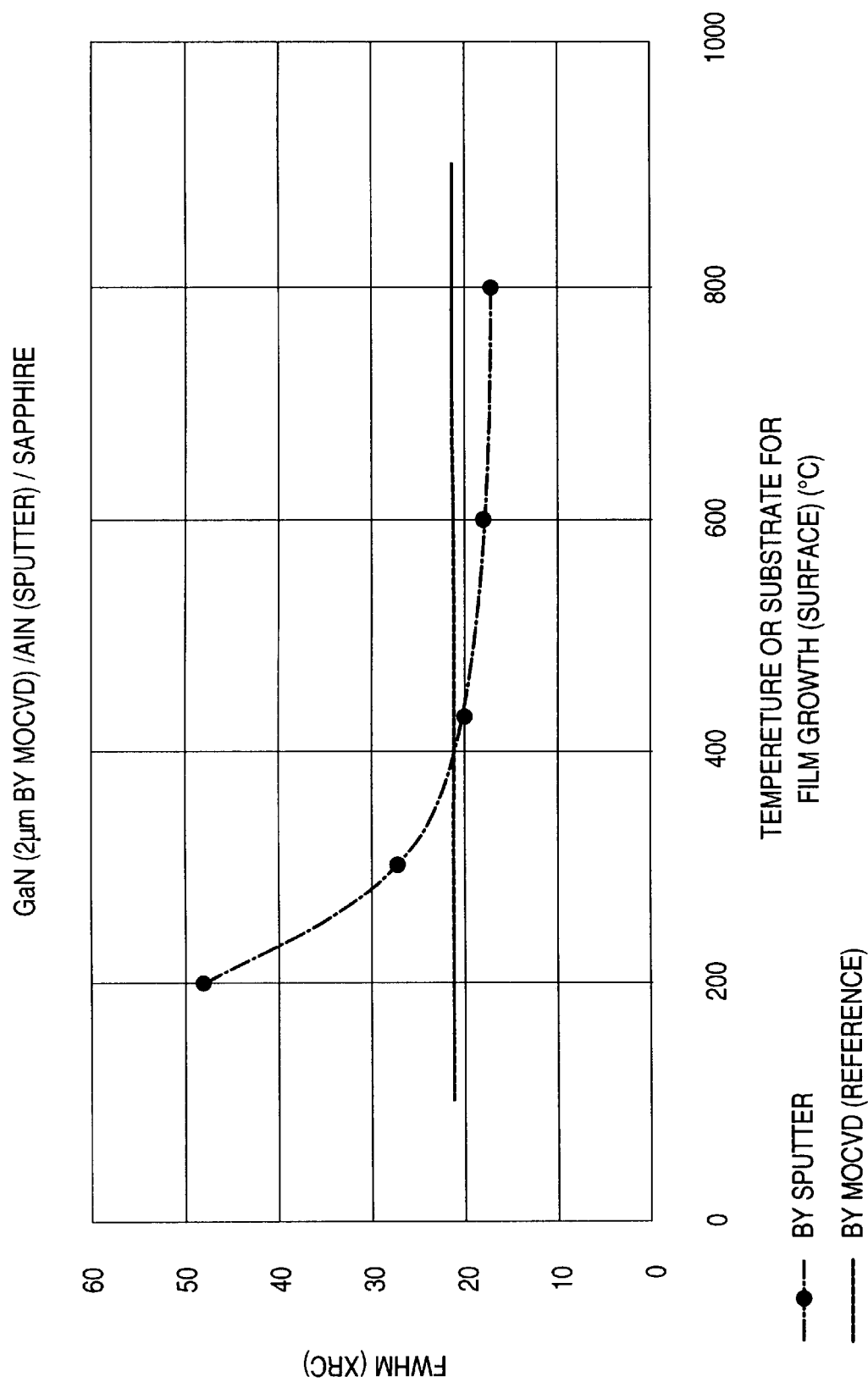
FIG. 2 is a graph showing the relation between the temperature for growth of AlN and the crystallinity of a GaN layer.

FIG. 2 shows the relation between the film-forming temperature for forming an AlN layer by a DC magnetron sputtering method and the crystallinity of a GaN layer (2 μm) formed on the AlN layer by an MOCVD method. In FIG. 2, the vertical axis expresses the half-value width (sec) of an X-ray rocking curve of the GaN layer. In the graph, the broken line expresses the half-value width of the X-ray rocking curve of a GaN layer in the case where AlN is formed by an MOCVD method (substrate temperature: 400° C.). It may safely be the that the obtained grade of crystallinity is sufficient for the GaN layer to constitute the function as the device.

Incidentally, measurement conditions in FIG. 2 are as follows.

Substrate: sapphire face a
AlN layer thickness: 640 Å
Sputter gas: Ar (8 sccm)/$N_2$ (10 sccm)
DC power: 0.5W (in an electrode area of about 182 $cm^2$)

It is apparent from the result of FIG. 2 that a GaN layer having a crystallinity equivalent to or more excellent than the crystallinity of a so-called low-temperature buffer layer in the background art is obtained when the substrate temperature for forming an AlN layer by a sputtering method is not lower than 400° C. Although the upper limit of the substrate temperature is not restricted specially, the substrate temperature is preferably set to be not higher than 1200° C. More preferably, the substrate temperature is set to be not higher than 1000° C. Further preferably, the substrate temperature is set to be not higher than 800° C. The upper limit of the substrate temperature is determined exclusively on the basis of the rated range of use of a sputtering system.

It can be thought that the result of FIG. 2 can be obtained regardless of the material for the substrate, the material (group III nitride compound) and method (not using metal organic compounds as raw materials) for producing the first layer and the material and method for producing the second layer (group III nitride compound semiconductor).

Second Group III Nitride Compound Semiconductor Layer

A second group III nitride compound semiconductor layer constitutes the function as a device. Examples of the device include optical devices such as a light-emitting diode, a photodetector, a laser diode, a solar cell, etc., bipolar devices such as a rectifier, a thyristor, a transistor, etc., unipolar devices such as an FET, etc., and electronic devices such as a microwave device, etc. Further, the present invention may be applied also to laminates which are intermediates of these devices.

Incidentally, a homostructure or a single or double heterostructure with MIS junction, PIN junction or p-n junction can be used as the structure of the light-emitting device. A quantum well structure (single or multiple quantum well structure) may be employed as a light-emitting layer.

The same material as that used in the first group III nitride compound layer described above can be used as a material for forming the second group III nitride compound semiconductor layer. The second group III nitride compound semiconductor layer may contain a dopant at option. Si, Ge, Se, Te, C, etc. may be used as n-type impurities. Mg, Zn, Be, Ca, Sr, Ba, etc. may be used as p-type impurities.

To obtain a more excellent crystallinity, a layer of GaN or $Al_xGa_{1-x}N$ (0X1) is preferably employed as the second group III nitride compound semiconductor layer which touches the first group III nitride compound layer.

Although the method for forming the second group III nitride compound semiconductor layer is not limited specially, this layer may be formed by a metal organic chemical vapor deposition method (MOCVD method) or by a known method such as a molecular beam epitaxy method (MBE method), a halide vapor phase epitaxy method (HVPE method), a liquid phase epitaxy method, or the like.

The first group III nitride compound layer is heated with rising of the substrate temperature when the second group III nitride compound semiconductor layer is formed by the MOCVD method.

A single gas of hydrogen or nitrogen or a mixture gas of hydrogen and nitrogen is preferably used as a carrier gas when the MOCVD method is executed.

In other words, the first group III nitride compound layer is preferably heated in an atmosphere of a mixture gas containing a hydrogen or nitrogen gas and nitrogen source gases (ammonia, hydrazine, etc.) so as to be recrystallized as described above. On this occasion, the temperature at which this layer is heated is preferably set to be in a range of from 1000° C. to 1250° C.

An embodiment of this invention will be described below.

Figure 3:
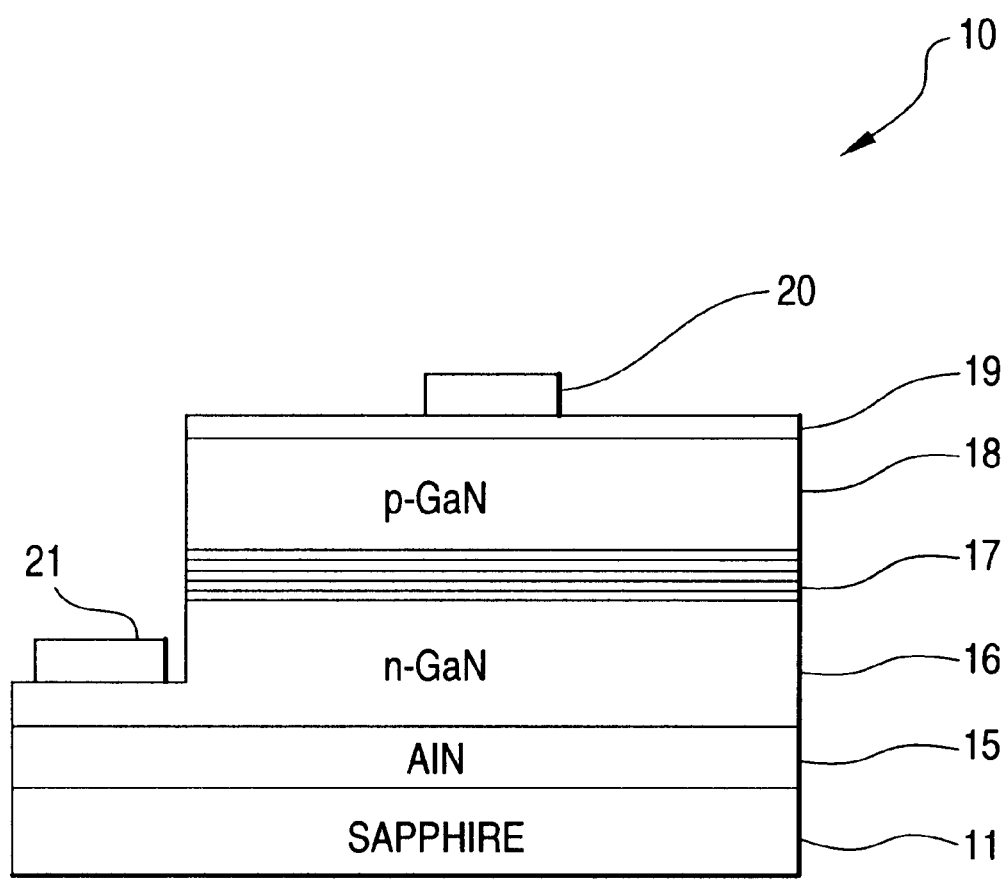
FIG. 3 shows a light-emitting diode as an embodiment of this invention.

The embodiment is a light-emitting diode (light-emitting device) 10, the configuration of which is shown in FIG. 3.

Specifications of respective layers are as follows.

TABLE 1

| Layer | Component | Dopant | (Thickness) |
|---|---|---|---|
| Light-transparency electrode 19 | | | |
| p-type clad layer 18 | p-GaN | Mg | (0.3 μm) |
| Light-emitting layer 17 | Superlattice structure | | |
| Quantum well layer | $In_{0.15}Ga_{0.85}N$ | | (35 Å) |
| Barrier layer | GaN | | (35 Å) |
| Number of repeated quantum well and barrier layers | 1 to 10 | | |
| n-type clad layer 16 | n-GaN | Si | (4 μm) |
| Buffer layer 15 | AlN | | (640 Å) |
| Substrate 11 | Sapphire (face a) | | (300 μm) |

The n-type clad layer 16 may be of a double-layered structure with an $n^-$ layer of a low electron density on the light-emitting layer 17 side and an $n^+$ layer of a high electron density on the buffer layer 15 side.

The light-emitting layer 17 is not limited to the superlattice structure. A single or double heterostructure, a homo-junction structure, or the like, may be used as the structure of the light-emitting layer.

A group III nitride compound semiconductor layer, which has a wide band gap and which is doped with an acceptor such as magnesium, or the like, may be interposed between the light-emitting layer 17 and the p-type clad layer 18. This technique is used for preventing electrons flowed into the light-emitting layer 17 from being diffused into the p-type clad layer 18. Further, the p-type clad layer 18 itself may be formed of p-AlGaN doped with Mg.

The p-type clad layer 18 may be of a double-layered structure with a $p^-$ layer of a low hole density on the light-emitting layer 17 side and a $p^+$ layer of a high hole density on the electrode side.

The light-emitting diode configured as described above is produced as follows.

First, a sapphire substrate is set in a reactor of a DC magnetron sputtering system and a buffer layer 15 is formed in the following conditions.

Substrate: sapphire face a

Substrate temperature: 430° C.

Thickness of AlN layer: 640 Å

Sputter gas: Ar (8 sccm)/$N_2$ (10 sccm)

DC power: 0.5W (in an electrode area of about 182 $cm^2$)

Then, the substrate is transfered into an MOCVD system, in which a second group III nitride compound semiconductor layer constituted by an n-type clad layer 16 and layers thereon is formed by a general-purpose method with a hydrogen gas as a carrier gas.

Then, after a mask is formed, the p-type clad layer 18, the light-emitting layer (active layer) 17 and the n-type clad layer 16 are partially removed by reactive ion etching so that a part of the n-type clad layer 16 in which an n-type electrode pad 21 is to be formed is revealed.

After a photo resist is applied onto the semiconductor surface uniformly, the photo resist is removed from an electrode-forming portion on the p-type clad layer 18 by photolithography so that this portion of the p-type clad layer 18 is exposed. An Au/Co light-transparency electrode layer 19 is formed on the exposed p-type clad layer 18 by a vapor deposition apparatus.

Then, a p-type electrode pad 20 and an n-type electrode pad 21 are formed by vapor deposition in the same manner as described above.

Although the above description in this specification has been made upon the case where a light-emitting device is taken as an example, this invention may be applied to various kinds of semiconductor devices and also to laminates which are intermediates of the semiconductor devices.

This invention is not limited to the descriptions of the mode for carrying out the invention and embodiments thereof at all, and includes various modifications that can be conceived by those skilled in the art without departing from the scope of claim for a patent.

The following items will be disclosed below.

(1) A group III nitride compound semiconductor device, comprising: a buffer layer of AlN formed by a sputtering method on a sapphire substrate at a temperature not lower than 400° C.; and a group III nitride compound semiconductor layer formed by an MOCVD method on the buffer layer while heating the sapphire substrate.

(2) A device stated in the item (1), wherein the buffer layer is formed on a face a of the sapphire substrate.

(3) A device stated in the item (1) or (2), wherein a carrier gas of hydrogen or nitrogen is used in the MOCVD method when the group III nitride compound semiconductor layer at least in contact with the buffer layer is formed.

(4) A laminate comprising: a substrate; a first group III nitride compound layer which has a thickness of from 50 Å to 3000 Å and which is formed on the substrate by a method not using metal organic compounds as raw materials; and a second group III nitride compound semiconductor layer which is formed on the first group III nitride compound layer.

(5) A laminate stated in the item (4), wherein the substrate is made of sapphire.

(6) A laminate stated in the item (5), wherein the first group III nitride compound layer is formed on a face a of the sapphire substrate.

(7) A laminate stated in any one of the items (4) to (6), wherein the method not using metal organic compounds as raw materials is selected from the group consisting of: a sputtering method inclusive of a reactive sputtering method; an evaporation method; an ion plating method; a laser ablation method; and an ECR method.

(8) A laminate stated in any one of the items (4) to (7), wherein the first group III nitride compound layer is made of $Al_xGa_{1-x}N$ (0<X<1).

(9) A laminate stated in any one of the items (4) to (7), wherein the first group III nitride compound layer is made of AlN.

(10) A laminate stated in any one of the items (4) to (9), wherein the thickness of the first group III nitride compound layer is not smaller than 100 Å but smaller than 1000 Å.

(11) A laminate stated in any one of the items (4) to (11), wherein the first group III nitride compound layer is formed on the substrate heated to a temperature not lower than 400° C.

(12) A laminate stated in any one of the items (4) to (11), wherein the first group III nitride compound layer is heated at a temperature of from 1000° C. to 1250° C., in an atmosphere of a mixture gas containing a hydrogen gas and an ammonia gas.

(13) A laminate stated in any one of the items (4) to (12), wherein the second group III nitride compound semiconductor layer is formed by an MOCVD method.

(14) A laminate comprising: a sapphire substrate; a first group III nitride compound layer which has a thickness of from 50 Å to 3000 Å and which is formed on the sapphire substrate by a sputtering method; and a second group III nitride compound semiconductor layer which is formed on the first group III nitride compound layer by an MOCVD method while the sapphire substrate is kept at a temperature of from 1000° C. to 1250° C.

(15) A laminate stated in the item (14), wherein the first group III nitride compound layer is made of AlN.

(16) A laminate stated in the item (14) or (15), wherein the thickness of the first group III nitride compound layer is not smaller than 100 Å but smaller than 1000 Å.

(17) A laminate stated in any one of the items (14) to (16), wherein a carrier gas of hydrogen or nitrogen is used in the MOCVD method for forming the second group III nitride compound semiconductor.

(18) A method of producing a laminate comprising the steps of: forming a buffer layer of AlN by a sputtering method on a sapphire substrate at a temperature not lower than 400° C; and forming a group III nitride compound semiconductor layer by an MOCVD method on the buffer layer while heating the sapphire substrate.

(19) A producing method stated in the item (18), wherein the buffer layer is formed on a face a of the sapphire substrate.

(20) A producing method stated in the item (18) or (19), wherein a carrier gas of hydrogen or nitrogen is used in the MOCVD method when the group III nitride compound semiconductor layer at least in contact with the buffer layer is formed.

Another embodiment of the producing method according to the present invention will be described below in detail.

Step 1

In step 1, a first group III nitride compound layer is formed on a substrate by any method other than the method using metal organic compounds as raw materials.

The concept the first group III nitride compound includes quaternary compounds represented by $Al_xGa_yIn_{1-X-Y}N$ (0<X<1, 0<Y<1, 0<X+Y<1), ternary compounds represented by $Al_xGa_{1-x}N$, $Al_xIn_{1-x}N$, $Ga_xIn_{1-x}N$, (0<X<1), and binary compounds represented by AlN, GaN and InN.

Although the thickness of the first group III nitride compound layer is not limited specially, the thickness is preferably set to be in a range of from 100 Å to 3000 Å in the same manner as in the background-art buffer layer formed by the MOCVD method. More preferably, the thickness is set to be in a range of from 100 Å to 2000 Å. Further preferably, the thickness is set to be in a range of from 100 Å to 300 Å.

A buffer layer of AlN was formed from high-purity metallic aluminum and a nitrogen gas as raw materials on a sapphire substrate by use of a DC magnetron sputtering system for executing a reactive sputtering method in the following conditions.

TABLE 2

| | AlN film thickness | | |
|---|---|---|---|
| | 150 Å | 600 Å | 2000 Å |
| Film-forming temperature: 430° C. | a | b | c |
| Film-forming temperature: room temperature | d | / | / |

Step 2

In step 2, the first group III nitride compound layer formed by the sputtering method as described above is heated in an atmosphere of a mixture gas containing a hydrogen or nitrogen gas and an ammonia gas. Hence, the crystallinity of the first group III nitride compound layer is improved.

Figure 7A:
FIGS. 7A to 7E show photographs of RHEED patterns of samples in Table 2.
Figure 7B:
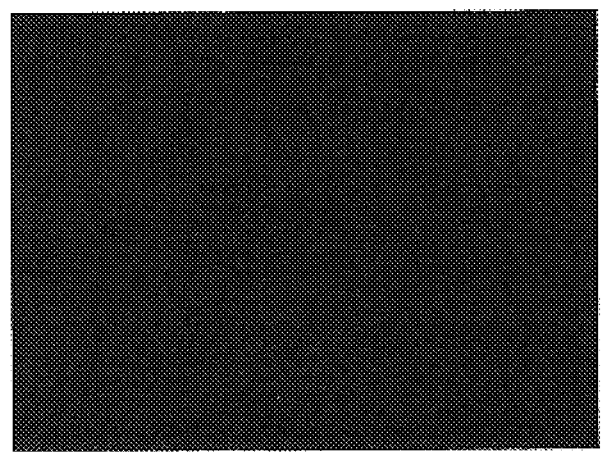
Figure 7C:
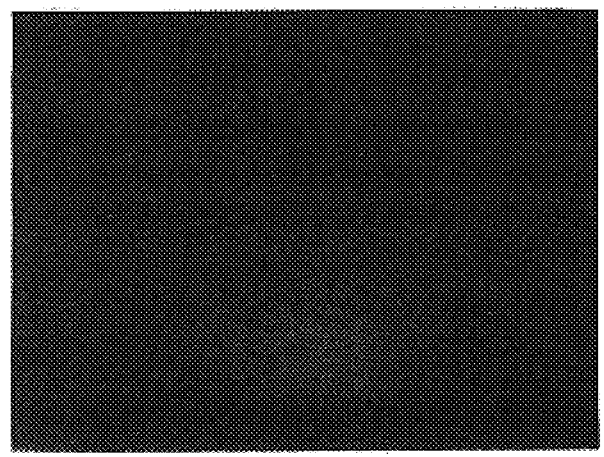
Figure 7D:
Figure 7E:
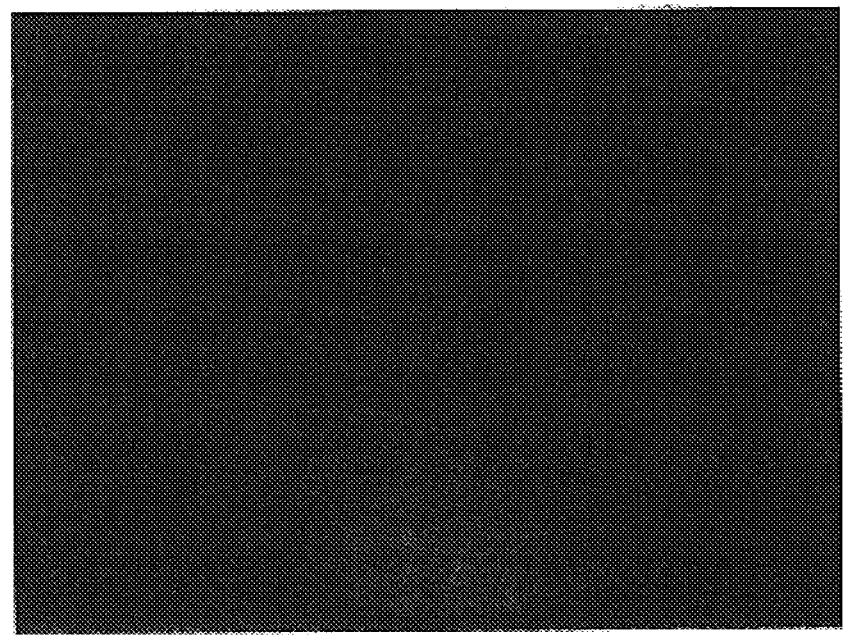

Respective RHEED patterns of the AlN layers (not heated) in samples a and d in Table 1 and the AlN layer in the sample a after heated at 1000° C. (5 minutes) in an atmosphere of a 1:0.3 mixture of a hydrogen gas and an ammonia gas were photographed as examples of the group III nitride compound semiconductor layer. FIG. 7A shows a photograph of an RHEED pattern of sample d in Table 2. FIGS. 7B and 7C show photographs of RHEED patterns of sample a in Table 2 which are different in the photographing angle with each other. FIGS. 7D and 7E show photographs of RHEED patterns of the AlN layer in the sample a after heated at 1000° C. (5 minutes) in an atmosphere of a 1:0.3 mixture of a hydrogen gas and an ammonia gas, which are different in the photographing angle with each other.

In the sample d obtained by growing the AlN layer at a room temperature, it was found that AlN was amorphous because there was observed no spot in the AlN layer (FIG. 7A).

In comparison between the RHEED pattern of the AlN layer of the sample a grown at 430° C. and further heated in an atmosphere of a mixture gas containing a hydrogen gas and an ammonia gas (FIGS. 7D and 7E) and the RHEED pattern of the AlN layer of the sample a obtained without such heating (FIGS. 7B and 7C), it could be confirmed that the crystallinity of the AlN layer was improved when the AlN layer was heated in an atmosphere of a mixture gas containing a hydrogen gas and an ammonia gas.

The mixture ratio of the hydrogen gas or the nitrogen gas to the ammonia gas is preferably set to be in a range of from 1:1 to 1:0.1 in terms of flow rate ratio. More preferably, the mixture ratio of the hydrogen gas to the ammonia gas is set to be in a range of from 1:0.5 to 1:0.1. Further preferably, the mixture ratio of the hydrogen gas or the nitrogen gas or the nitrogen gas to the ammonia gas is set to be 1:0.3.

The heating condition is preferably set to be in a range of from 1000° C. to 1250° C. More preferably, it is set to be in a range of from 1050° C. to 1200° C. Further preferably, it is set to be in a range of from 1100° C. to 1150° C.

Step 3

In step 3, a second group III nitride compound semiconductor layer is formed on the first group III nitride compound layer.

The second group III nitride compound semiconductor is represented by the general formula $Al_xGa_yIn_{1-X-Y}N$ (0X1, 0Y1, 0X+Y1), which may contain other group III elements such as boron (B) and thallium (Tl) and in which the nitrogen (N) may be partially replaced by phosphorus (P), arsenic (As), antimony (Sb) or bismuth (Bi). The group III nitride compound semiconductor may contain a dopant at option.

The method for forming the group III nitride compound semiconductor layer is not limited specifically. For example, the group III nitride compound semiconductor layer is formed by a known MOCVD method. Alternatively, the group III nitride compound semiconductor layer may be formed also by a known MBE method, a HVPE method, or the like.

When the MOCVD method is used for growing the group III nitride compound semiconductor layer, it is preferable from the point of view of reduction in number of producing steps that a sample is set in a susceptor of an MOCVD apparatus and subjected to the step 2 in a reactor of the MOCVD apparatus. In this case, the upper limit of the temperature for heating is determined on the basis of the performance of the reactor. In a general-purpose MOCVD apparatus, the upper limit of the reaction temperature is 1250° C. This is because quartz is used as a constituent member. If quartz is not used, heating at a higher temperature can be made.

Further, temperature control is preferably made easily when the temperature for heating is set to be substantially equal to the temperature for growth of the second group III nitride compound semiconductor layer.

Figure 8:
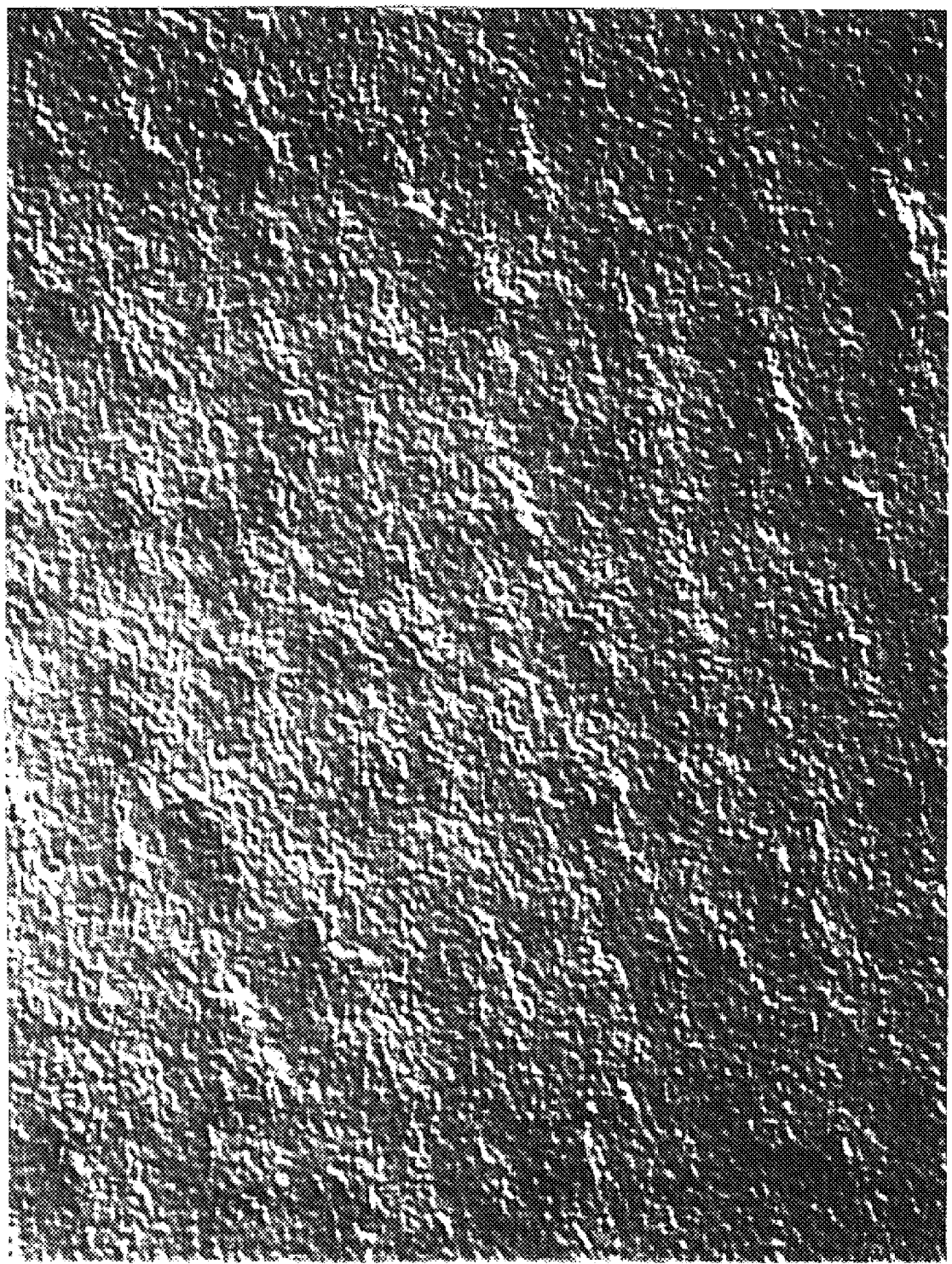
FIG. 8 shows a photomicrograph of the sample a in Table 2.
Figure 9:
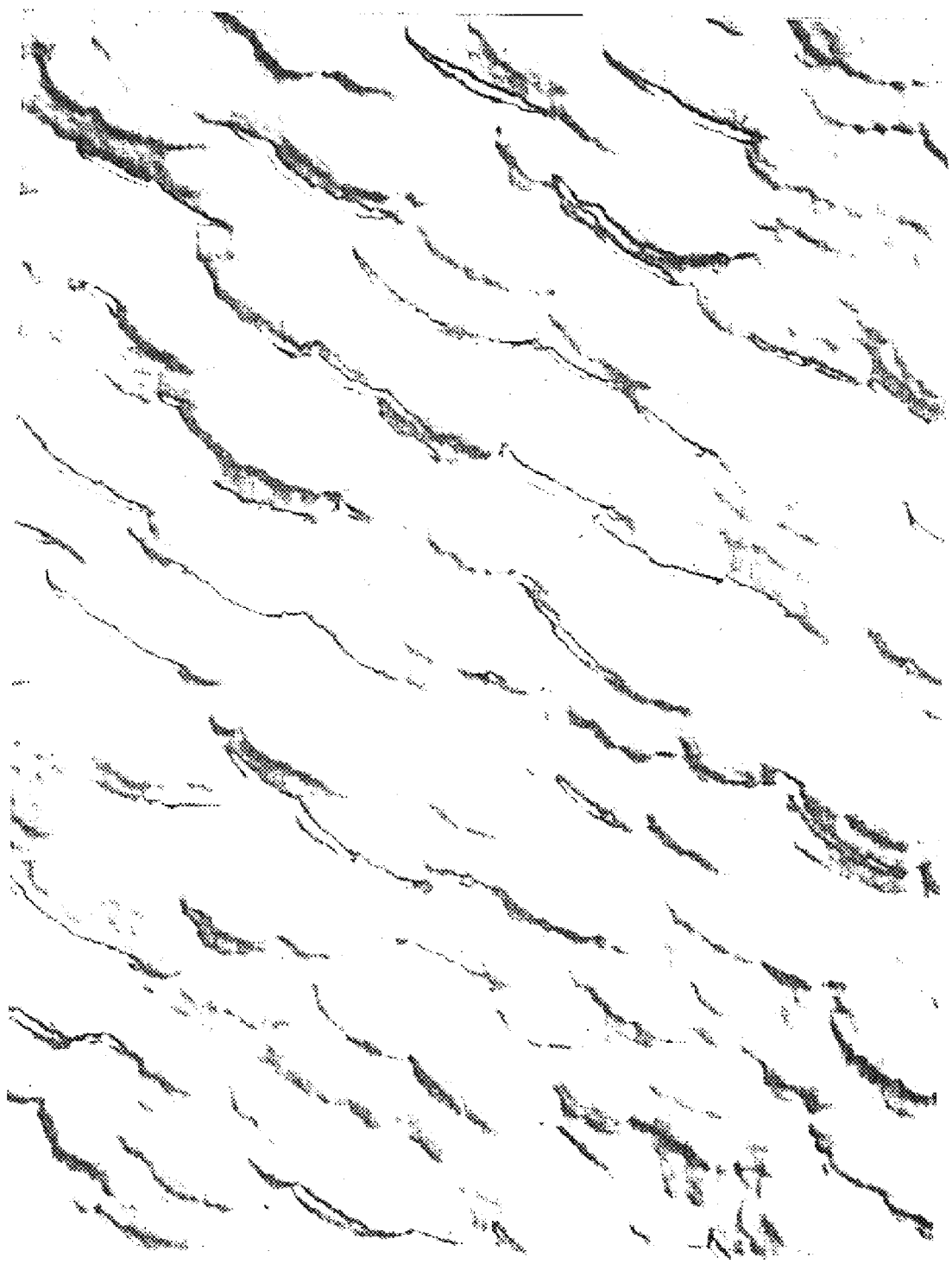
FIG. 9 shows a photomicrograph of the sample b in Table 2.
Figure 10:
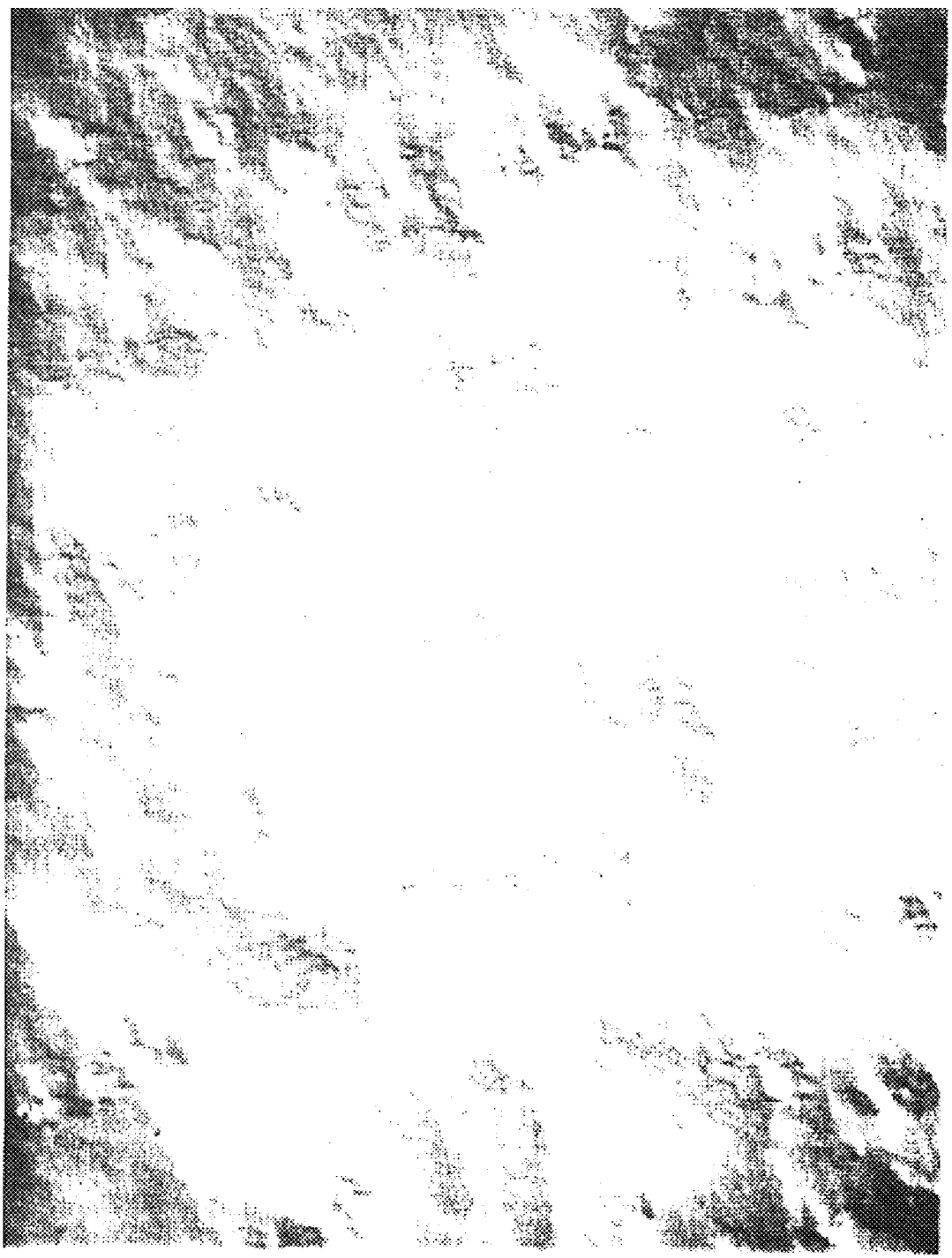
FIG. 10 shows a photomicrograph of the sample c in Table 2.
Figure 11:
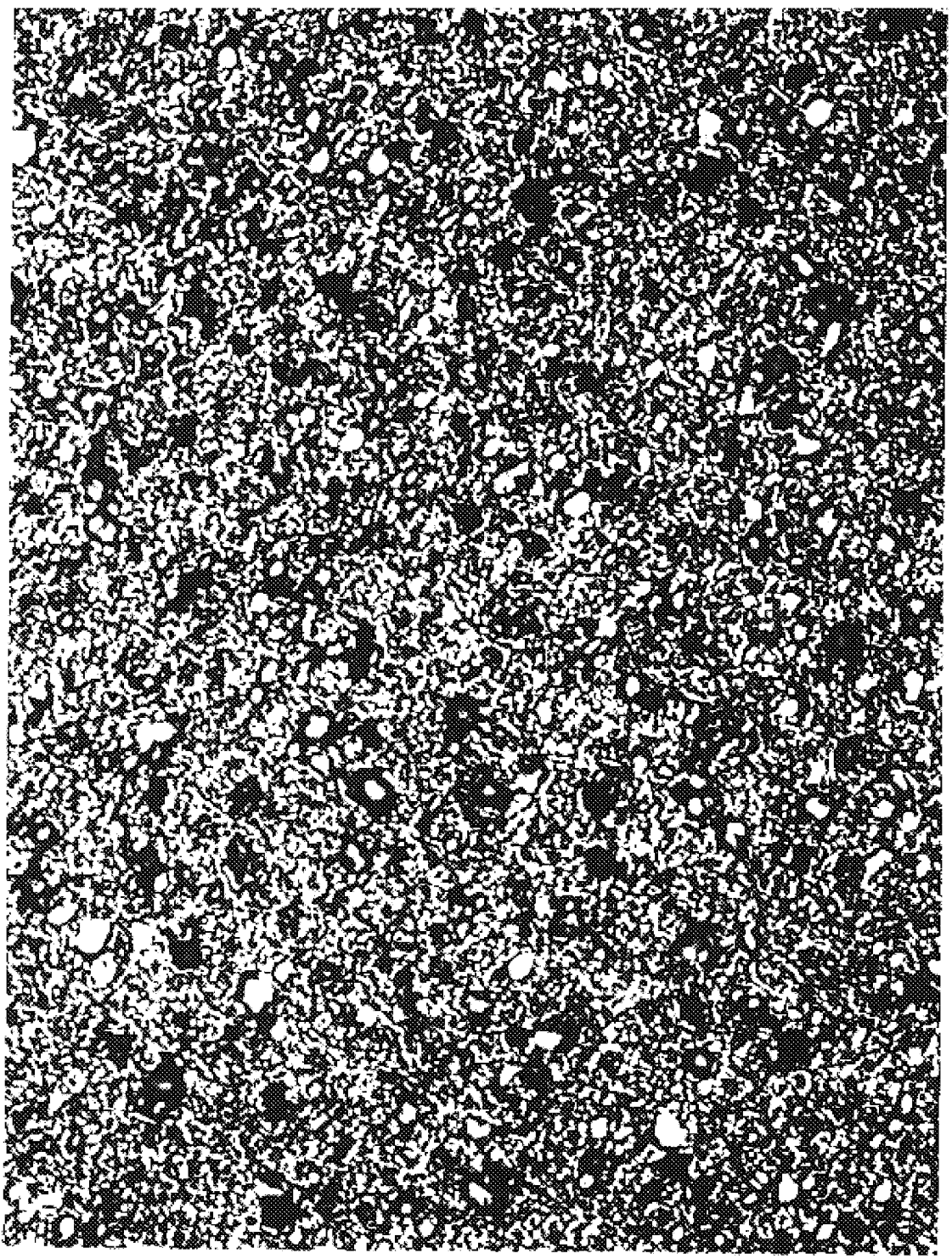
FIG. 11 shows a photomicrograph of the sample d in Table 2.

The AlN layer in each of the samples a to d in Table 2 was heated at 1000° C. (5 minutes) in an atmosphere of a 1:0.3 mixture of a hydrogen gas and an ammonia gas so that a GaN layer 1 µm thick was grown at 1100° C. and formed on the AlN layer by the MOCVD method. Optical photomicrographs of surfaces of the respective GaN layers obtained in the aforementioned manner were taken. FIG. 8 shows a photomicrograph of the sample a FIG. 9 shows sample b, FIG. 10 shows sample c, and FIG. 11 shows sample d.

From the photomicrographs, it is understood that the surface of the GaN layer formed on the AlN layer in each of the samples a to c was provided as a mirror surface. Hence, another group III nitride compound semiconductor layer having an excellent crystallinity can be further grown on the surface of the GaN layer.

On the other hand, it is understood that the surface of the GaN layer formed on the AlN layer of the sample d was not provided as a mirror surface. This result shows the same tendency when the temperature for growth of GaN is in a wide range of from 900° C. to 1200° C.

It is preferable from the aforementioned result that the temperature for forming the first group III nitride compound layer by a method not using organic aluminum as a raw material is set to be in a range of from 200° C. to 800° C. More preferably, the temperature is in a range of from 300° C. to 800° C. Further preferably, the temperature is in a range of from 400° C. to 800° C.

Figure 4:
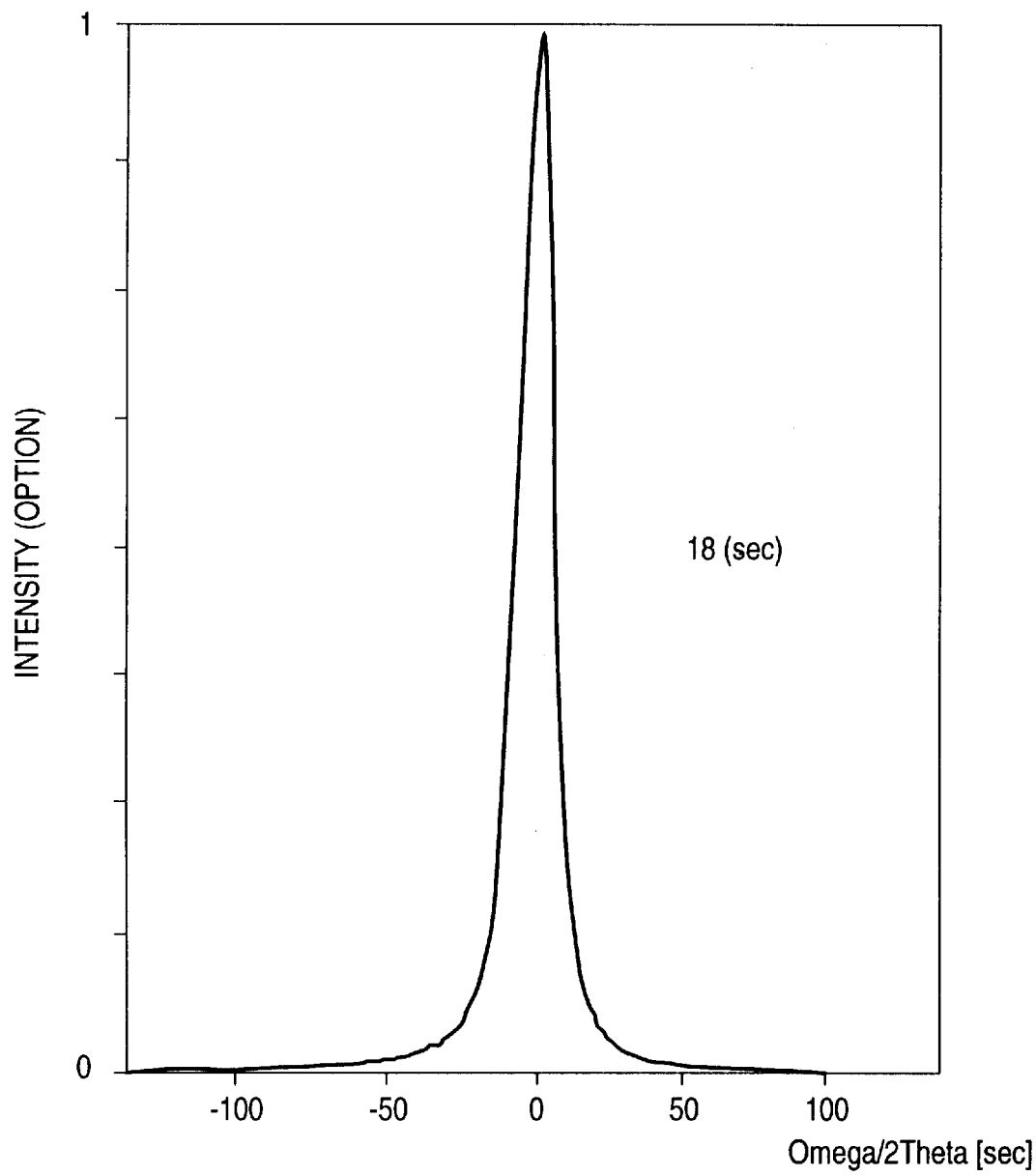
FIG. 4 shows a rocking curve of a GaN layer which is formed by an MOCVD method so as to be grown on an AlN buffer layer (sample a in Table 2 formed by a DC magnetron sputtering method.
Figure 5:
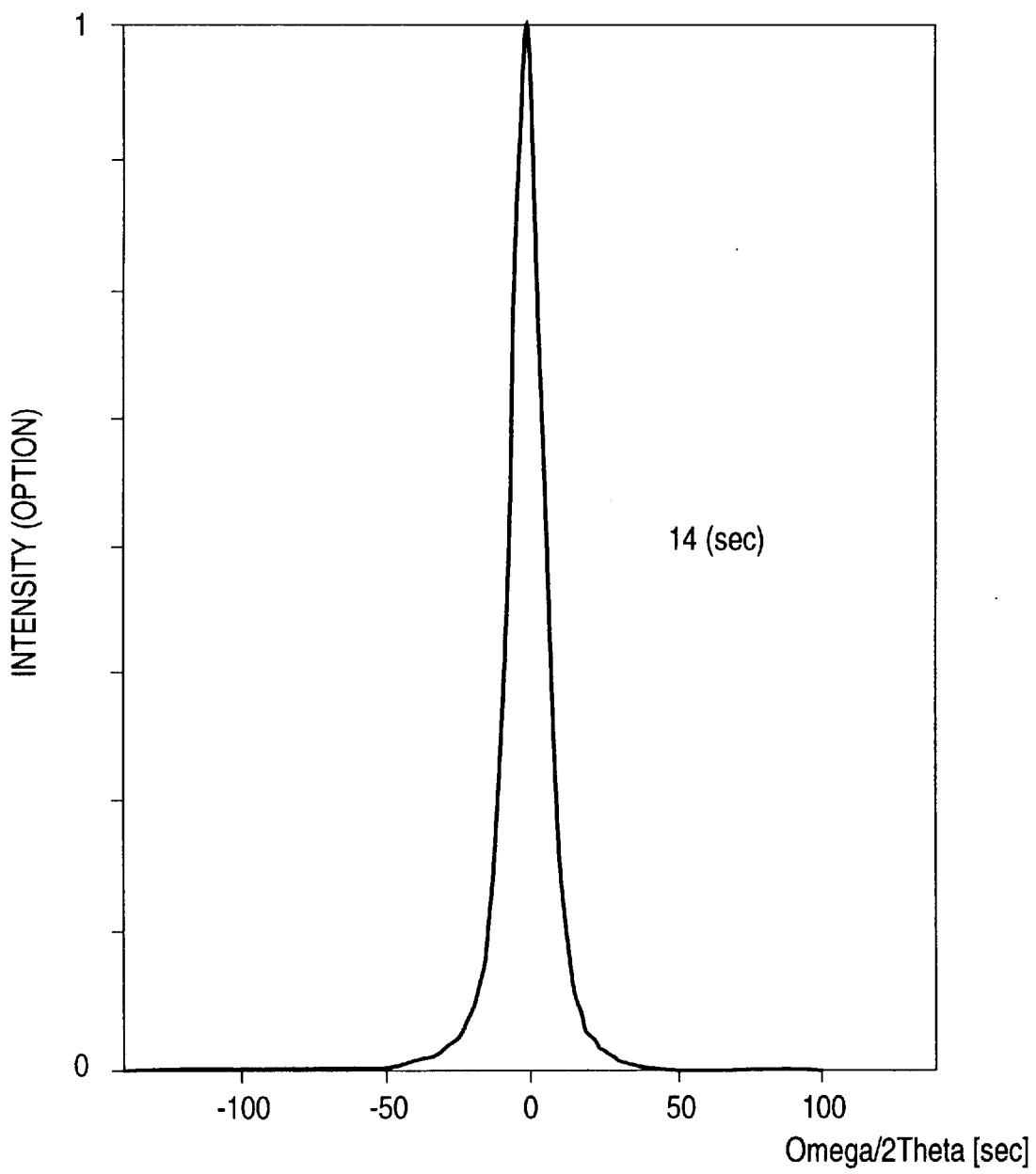
FIG. 5 shows a rocking curve of a GaN layer which is formed by an MOCVD method so as to be grown on an AlN buffer layer (sample b in Table 2 formed by a DC magnetron sputtering method.
Figure 6:
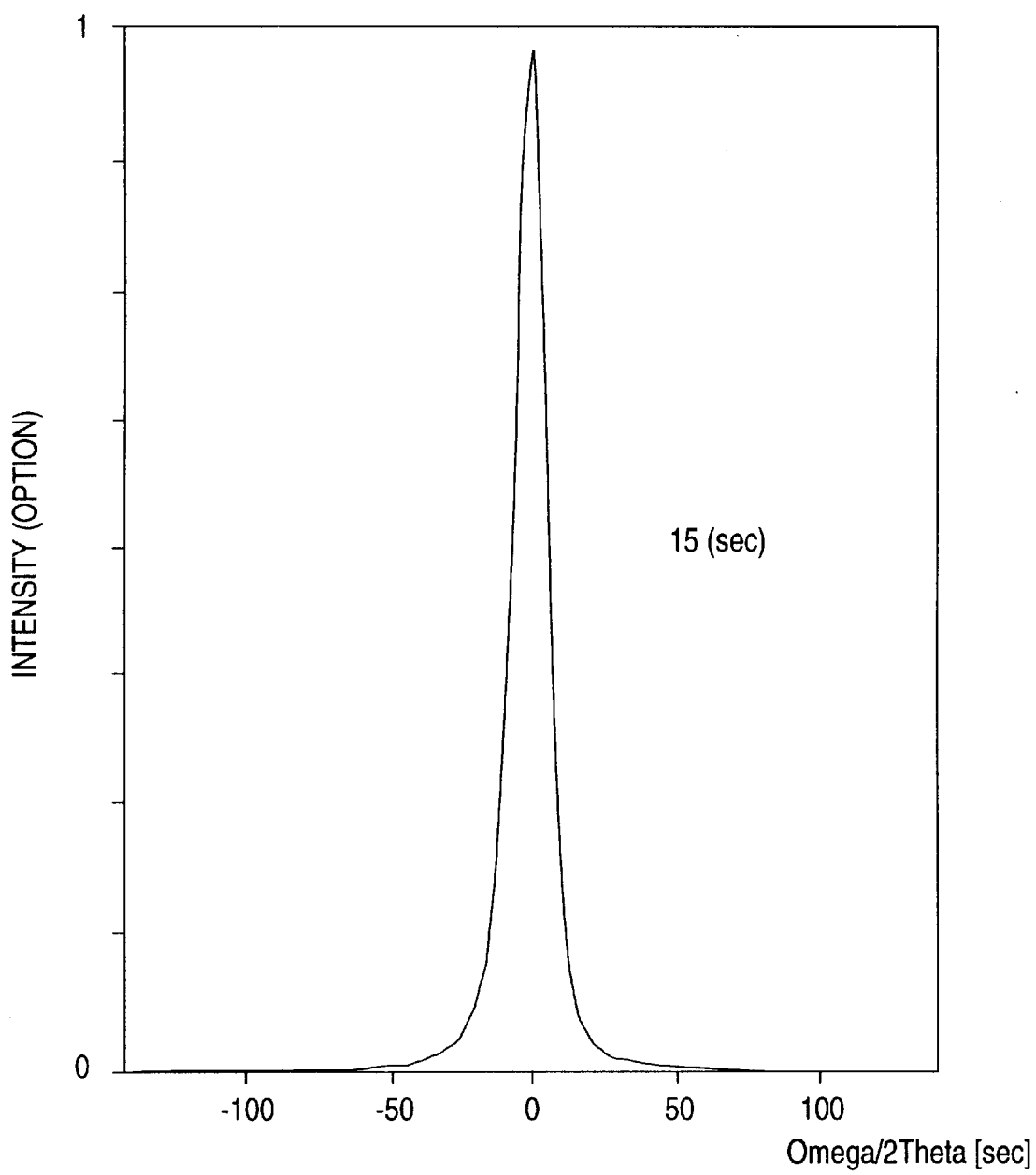
FIG. 6 shows a rocking curve of a GaN layer which is formed by an MOCVD method so as to be grown on an AlN buffer layer (sample c in Table 2 formed by a DC magnetron sputtering method.

The AlN layer in each of the samples a to c in Table 2 was heated at 1000° C. (5 minutes) in an atmosphere of a 1:0.3 mixture of a hydrogen gas and an ammonia gas so that a GaN layer 4 µm thick was grown at 1100° C. and formed on the AlN layer by the MOCVD method. The reason why the GaN layer is 4 µm thick is that a group III nitride compound semiconductor layer having such a thickness is usually formed on a buffer layer in a general light-emitting device. FIGS. 4 to 6 show respective rocking curves of the 4 µm-thick GaN layers obtained in the aforementioned manner. Incidentally, the rocking curves were obtained by execution of ω-2θ scanning in use of an X-ray diffraction apparatus (X-pert) made by Phillips.

The crystallinity of each of the GaN layers in FIGS. 4 to 6 is equivalent to or more excellent than the crystallinity of the GaN layer which is formed, by the MOCVD method, on the buffer layer of a group III nitride compound semiconductor such as AlN, or the like, formed by the same MOCVD method. That is, the results of FIGS. 4 to 6 support the fact that the second group III nitride compound semiconductor layer formed on the buffer layer formed by sputtering by heating in a predetermined atmosphere, can be put into practical use sufficiently.

A semiconductor device is constituted by the second group III nitride compound semiconductor layer formed in the aforementioned manner. A known double heterostructure or a known superlattice structure is employed in the case of a light-emitting device. Further, a functional device represented by an FET structure may be configured.

The light-emitting device 10 shown in FIG. 3 was produced by the producing method according to this embodiment. Specifications of respective layers in the light-emitting device 10 in this embodiment are as follows.

TABLE 3

| Layer | Component | Dopant | (Thickness) |
|---|---|---|---|
| Light-transparency electrode 19 | | | |
| p-type clad layer 18 | p-GaN | Mg | (3,000 Å) |
| Light-emitting layer 17 | Superlattice structure | | |
| Quantum well layer | $In_{0.15}Ga_{0.85}N$ | | (35 Å) |
| Barrier layer | GaN | | (35 Å) |
| Number of repeated quantum well and barrier layers | 1 to 10 | | |
| n-type clad layer 16 | n-GaN | Si | (25,000 Å) |
| Buffer layer 15 | AlN | | (150 Å) |
| Substrate 11 | Sapphire (face a) | | (300 µm) |

For production of the light-emitting device 10, first, a sapphire substrate 11 is set in a DC magnetron sputtering system. A buffer layer 15 of AlN is formed on the sapphire substrate by using high-purity aluminum as a target and a mixture of an argon gas and a nitrogen gas as a sputter gas. On this occasion, the substrate is kept at 430° C.

Then, the substrate 11 having the buffer layer 15 formed thereon is taken out from the sputtering system and set in a susceptor of a reaction chamber of an MOCVD apparatus. The substrate 11 is left for 5 minutes in the condition that the substrate 11 is heated to a temperature not lower than 1000° C. while 10 liters per minute of a hydrogen gas and 3 liters per minute of an ammonia gas are made to flow.

Then, an n-type clad layer 16, a light-emitting layer 17 and a p-type clad layer 18 are grown by the ordinary method of MOCVD.

After the p-type clad layer 18 is formed, the p-type clad layer 18, the light-emitting layer 17 and the n-type clad layer 16 are partially removed by reactive ion etching, or the like. Then, an n-type electrode pad 21 is formed on the etched surface of the n-type clad layer 16 by evaporation method.

A transparency electrode 19, which is constituted by a thin film containing gold, is laminated to cover the substantially whole upper surface of the p-type clad layer 18. A p-type electrode pad 20, which is also constituted by a material containing gold, is formed on the light-transparency electrode 19 by vapor deposition.

From the fact that it was possible to form a more excellent second group III nitride compound semiconductor layer according to the present invention, it was proved that a light-emitting diode having light-emitting efficiency equivalent to or more excellent than that of the background-art light-emitting diode can be produced and that the industrial applicability of the present invention is very high.

The device according to the present invention is not limited to the aforementioned light-emitting diode, but may be applied also to other optical devices such as a photodetector a laser diode, a solar cell, etc., bipolar devices such as a thyristor, a transistor, etc., unipolar devices such as an FET, etc., and electronic devices such as a microwave device, etc.

Further, the present invention may be applied also to laminates which are intermediates of these devices.

This invention is not limited to the aforementioned descriptions of the mode for carrying out the invention and embodiments thereof at all, but includes various modifications that can be conceived by those skilled in the art without departing from the scope of claim for a patent.

The following items will be disclosed below.

(21) A method of producing a group III nitride compound semiconductor device, wherein the method not using metal organic compounds as raw materials is a DC magnetron sputtering method.

(22) A producing method stated in the item (21) wherein the first group III nitride compound semiconductor layer contains, as a dopant, at least one member selected from the group consisting of group II elements, group IV elements, and group VI elements.

(23) A producing method stated in the item (21) wherein the first group III nitride compound semiconductor layer of AlN contains, as a dopant, one member selected from the group consisting of Si, Ge, S, Te, Mg, and Zn.

(24) A group III nitride compound semiconductor device, wherein the substrate is made of sapphire.

(25) A device stated in the item (24), wherein the group III nitride compound semiconductor is formed on a face a of the sapphire substrate.

(26) A device stated in the item (24) or (25), wherein the method not using metal organic compounds as raw materials is selected from the group consisting of: a sputtering method inclusive of a reactive sputtering method; an evaporation method; an ion plating method; a laser ablation method; and an ECR method.

(27) A device stated in any one of the items (24) to (26), wherein the first group III nitride compound semiconductor layer is made of $Al_xGa_{1-x}N$ (0X1).

(28) A device stated in any one of the items (24) to (26), wherein the first group III nitride compound semiconductor layer is made of AlN.

(29) A device stated in any one of the items (24) to (28), wherein a mixture ratio of the hydrogen gas to the ammonia gas is in a range of from 1:0.1 to 1:1 in terms of flow rate ratio.

(30) A device stated in any one of the items (24) to (28), wherein a mixture ratio of the hydrogen gas to the ammonia gas is in a range of from 1:0.1 to 1:0.5 in terms of flow rate ratio.

(31) A device stated in any one of the items (24) to (28), wherein a mixture ratio of the hydrogen gas to the ammonia gas is about 1:0.3 in terms of flow rate ratio.

(32) A device stated in any one of the items (24) to (31), wherein the temperature at which the first group III nitride compound semiconductor layer is heated is in a range of from 1000° C. to 1250° C.

(33) A device stated in any one of the items (24) to (32), wherein the second group III nitride compound semiconductor layer is formed by a method using metal organic compounds as raw materials.

(34) A device stated in the item (33), wherein the method using metal organic compounds as raw materials is an MOCVD method.

(35) A device stated in the item (34), wherein the temperature for growth of the group III nitride compound semiconductor by the MOCVD method is not lower than 1000° C.

(36) A device stated in the item (26), wherein the method not using metal organic compounds as raw materials is a DC magnetron sputtering method.

(37) A device stated in any one of the items (24) to (36), wherein the first group III nitride compound semiconductor layer contains, as a dopant, at least one member selected from the group consisting of group II elements, group IV elements, and group VI elements.

(38) A device stated in any one of the items (24) to (36), wherein the first group III nitride compound semiconductor layer of AlN contains, as a dopant, one member selected from the group consisting of Si, Ge, S, Te, Mg, and Zn.

(39) A method of producing a laminate, comprising the steps of: forming a first group III nitride compound semiconductor layer on a substrate by a method not using metal organic compounds as raw materials; heating the first group III nitride compound semiconductor layer in an atmosphere of a mixture gas containing a hydrogen gas and an ammonia gas; and forming a second group III nitride compound semiconductor layer on the first group III nitride compound semiconductor layer.

(40) A producing method stated in the item (39), wherein the substrate is made of sapphire.

(41) A producing method stated in the item (40), wherein the group III nitride compound semiconductor is formed on a face a of the sapphire substrate.

(42) A producing method stated in any one of the items (39) to (41), wherein the method not using metal organic compounds as raw materials is selected from the group consisting of: a sputtering method inclusive of a reactive sputtering method; an evaporation method; an ion plating method; a laser ablation method; and an ECR method.

(43) A producing method in any one of the items (39) to (42), wherein the first group III nitride compound semiconductor layer is made of $Al_xGa_{1-x}N$ (0X1).

(44) A producing method in any one of the items (39) to (42), wherein the first group III nitride compound semiconductor layer is made of AlN.

(45) A producing method in any one of the items (39) to (44), wherein a mixture ratio of the hydrogen gas to the ammonia gas is in a range of from 1:0.1 to 1:1 in terms of flow rate ratio.

(46) A producing method in any one of the items (39) to (44), wherein a mixture ratio of the hydrogen gas to the ammonia gas is in a range of from 1:0.1 to 1:0.5 in terms of flow rate ratio.

(47) A producing method in any one of the items (39) to (44), wherein a mixture ratio of the hydrogen gas to the ammonia gas is about 1:0.3 in terms of flow rate ratio.

(48) A producing method in any one of the items (39) to (47), wherein the temperature at which the first group III nitride compound semiconductor layer is heated is in a range of from 1000° C. to 1250° C.

(49) A producing method in any one of the items (39) to (48), wherein the second group III nitride compound semiconductor layer is formed by a method using metal organic compounds as raw materials.

(50) A producing method in the item (49), wherein the method using metal organic compounds as raw materials is an MOCVD method.

(51) A producing method in the item (50), wherein the temperature for growth of the group III nitride compound semiconductor by the MOCVD method is not lower than 1000° C.

(52) A laminate comprising a buffer layer of a first group III nitride compound semiconductor, and a layer of a second group III nitride compound semiconductor formed on the buffer layer, wherein the buffer layer is formed by a method not using metal organic compounds as raw materials and is heated in an atmosphere of a mixture gas containing a hydrogen gas and an ammonia gas before formation of the second group III nitride compound semiconductor layer.

(53) A producing method stated in the item (42), wherein the method not using metal organic compounds as raw materials is a DC magnetron sputtering method.

(54) A producing method stated in any one of the items (39) to (51) and (53), wherein the first group III nitride compound semiconductor layer contains, as a dopant, at least one member selected from the group consisting of group II elements, group IV elements, and group VI elements.

(55) A producing method stated in any one of the items (39) to (51) and (53), wherein the first group III nitride compound semiconductor layer of AlN contains, as a dopant, one member selected from the group consisting of Si, Ge, S, Te, Mg, and Zn.

(56) A laminate stated in the item (52), wherein the substrate is made of sapphire.

(57) A laminate stated in the item (56), wherein the group III nitride compound semiconductor is formed on a face a of the sapphire substrate.

(58) A laminate stated in any one of the items (52), (56) and (57), wherein the method not using metal organic compounds as raw materials is selected from the group consisting of: a sputtering method inclusive of a reactive sputtering method; an evaporation method; an ion plating method; a laser ablation method; and an ECR method.

(59) A laminate stated in any one of the items (52) and (56) to (58), wherein the first group III nitride compound semiconductor layer is made of $Al_xGa_{1-x}N$ (0X1).

(60) A laminate stated in any one of the items (52) and (56) to (58), wherein the first group III nitride compound semiconductor layer is made of AlN.

(61) A laminate stated in any one of the items (52) and (56) to (60), wherein a mixture ratio of the hydrogen gas to the ammonia gas is in a range of from 1:0.1 to 1:1 in terms of flow rate ratio.

(62) A laminate stated in any one of the items (52) and (56) to (60), wherein a mixture ratio of the hydrogen gas to the ammonia gas is in a range of from 1:0.1 to 1:0.5 in terms of flow rate ratio.

(63) A laminate stated in any one of the items (52) and (56) to (60), wherein a mixture ratio of the hydrogen gas to the ammonia gas is about 1:0.3 in terms of flow rate ratio.

(64) A laminate stated in any one of the items (52) and (56) to (63), wherein the temperature at which the first group III nitride compound semiconductor layer is heated is in a range of from 1000° C. to 1250° C.

(65) A laminate stated in any one of the items (52) and (56) to (64), wherein the second group III nitride compound semiconductor layer is formed by a method using metal organic compounds as raw materials.

(66) A laminate stated in the item (65), wherein the method using metal organic compounds as raw materials is an MOCVD method.

(67) A laminate stated in the item (66), wherein the temperature for growth of the group III nitride compound semiconductor by the MOCVD method is not lower than 1000° C.

(68) A laminate stated in the item (58), wherein the method not using metal organic compounds as raw materials is a DC magnetron sputtering method.

(69) A laminate stated in any one of the items (52) and (56) to (68), wherein the first group III nitride compound semiconductor layer contains, as a dopant, at least one member selected from the group consisting of group II elements, group IV elements, and group VI elements.

(70) A laminate stated in any one of the items (52) and (56) to (68), wherein the first group III nitride compound semiconductor layer of AlN contains, as a dopant, one member selected from the group consisting of Si, Ge, S, Te, Mg, and Zn.

What is claimed is:

1. A group III nitride compound semiconductor device, comprising:
    a substrate;
    a first group III nitride compound layer having a thickness of from 50 Å to 3000 Å and being formed on said substrate by a method not using metal organic compounds as raw materials; and
    a second group III nitride compound semiconductor layer being formed on said first group III nitride compound layer,
    wherein said substrate is at a temperature not less than 400° C. when said first group III nitride compound semiconductor layer is formed thereon, and
    wherein said first group III nitride compound semiconductor layer is subjected to a heat treatment in a range of 1050° C. to 1200° C. before said second group III nitride compound semiconductor layer is formed thereon.

2. A device according to claim 1, wherein said substrate comprises a sapphire substrate.

3. A device according to claim 2, wherein said first group III nitride compound semiconductor layer is formed on a face a of said sapphire substrate.

4. A device according to claim 1, wherein said method not using metal organic compounds as raw materials is selected from the group consisting of: a sputtering method, an evaporation method, an ion plating method, a laser ablation method, and an electron cyclotron resonance (ECR) method.

5. A device according to claim 1, wherein said first group III nitride compound semiconductor layer comprises $Al_xGa_{1-x}N$ (0≦X≦1).

6. A device according to claim 1, wherein said first group III nitride compound semiconductor layer comprises AlN.

7. A device according to claim 1, wherein the thickness of said first group III nitride compound semiconductor layer is not smaller than 100 Å but smaller than 1000 Å.

8. A device according to claim 1, wherein said first group III nitride compound semiconductor layer is formed on said substrate heated to a temperature of 430° C.

9. A device according to claim 1, wherein said first group III nitride compound semiconductor layer is heated in an atmosphere of a mixture gas comprising ammonia gas and at least one of hydrogen gas and nitrogen gas.

10. A group III nitride compound semiconductor device, comprising:
    a substrate;
    a first group III nitride compound semiconductor layer having a thickness of from 50 Å to 3000 Å and being formed on said substrate by a method not using metal organic compounds as raw materials; and
    a second group III nitride compound semiconductor layer being formed on said first group III nitride compound layer,
    wherein said second group III nitride compound semiconductor layer is formed by a metal organic chemical vapor deposition method, and
    wherein said first group III nitride compound semiconductor layer is subjected to a heat treatment in a range of 1050° C. to 1200° C. before said second group III nitride compound semiconductor layer is formed thereon.

11. A group III nitride compound semiconductor device, comprising:
a sapphire substrate;
a first group III nitride compound semiconductor layer having a thickness of from 50 Å to 3000 Å and being formed on said sapphire substrate by a sputtering method; and
a second group III nitride compound semiconductor layer formed on said first group III nitride compound semiconductor layer by a metal organic chemical vapor deposition method,
wherein said first group III nitride compound semiconductor layer is subjected to a heat treatment in a range of 1050° C. to 1200° C. before said second group III nitride compound semiconductor layer is formed thereon.

12. A device according to claim 11, wherein said first group III nitride compound layer comprises AlN.

13. A device according to claim 11, wherein the thickness of said first group III nitride compound layer is not smaller than 100 Å but smaller than 1000 Å.

14. A device according to claim 11, wherein a carrier gas of hydrogen or nitrogen is used in said metal organic chemical vapor deposition method for forming said second group III nitride compound semiconductor layer.

15. A group III nitride compound semiconductor device, comprising:
a buffer layer comprising a first group III nitride compound semiconductor layer; and
a second group III nitride compound semiconductor layer formed on said buffer layer;
wherein said buffer layer is formed on a substrate having a temperature not less than 400° C. by a method not using metal organic compounds as raw materials and is heated in an atmosphere of a mixture of gases containing hydrogen or nitrogen gas and ammonia gas before formation of said second group III nitride compound semiconductor layer, and
wherein said first group III nitride compound semiconductor layer is subjected to a heat treatment in a range of 1050° C. to 1200° C. before said second group III nitride compound semiconductor layer is formed thereon.

16. A device according to claim 1, wherein said first group III nitride compound semiconductor layer said second group III nitride compound semiconductor layer comprises a device layer.

17. A device according to claim 1, wherein said first group III nitride compound semiconductor layer comprises a polycrystalline group III nitride compound semiconductor layer.

18. A device according to claim 1, wherein said first group III nitride compound semiconductor layer is formed by a method other than molecular beam epitaxy (MBE).

19. A device according to claim 1, wherein said first group III nitride compound semiconductor layer is formed by at least one of sputtering, evaporation, ion plating, and laser ablation.

20. A device according to claim 1, wherein a crystallinity of said second group III nitride compound semiconductor layer is based on a thickness of said first group III nitride compound semiconductor layer.

21. A device according to claim 1, wherein said second group III nitride compound semiconductor layer comprises a group III nitride compound which is different from a group III nitride compound in said first group III nitride compound semiconductor layer.

22. A group III nitride compound semiconductor device, comprising:
a first layer comprising a group III nitride compound semiconductor having a thickness of from 50Å to 3000Å and formed on a substrate having a temperature not less than 400° C.; and
a second layer comprising a group III nitride compound semiconductor formed on said first layer, and having a crystallinity characterized b an x-ray rocking curve having a full width at half maximum (FWHM) of less than about 25 seconds,
wherein said first layer is subjected to a heat treatment in a range of 1050° C. to 1200° C. before said second layer is formed thereon.

23. A device according to claim 1, wherein the first group III nitride compound semiconductor layer is formed in an atmosphere of a mixture gas comprising ammonia gas and at least one of hydrogen gas and nitrogen gas, the mixture ratio of the hydrogen gas or the nitrogen gas to ammonia gas being set to be in a range of from 1:1 to 1:0.1 in terms of flow rate ratio.

24. A device according to claim 1, wherein said method not using metal organic compounds as raw materials comprises a DC magnetron sputtering method.

25. A device according to claim 1, wherein said substrate comprises a sapphire substrate and the first group III nitride compound semiconductor layer is formed on a face a of the sapphire substrate.

26. A device according to claim 10, wherein the first group III nitride compound semiconductor layer is formed in an atmosphere of a mixture gas comprising ammonia gas and at least one of hydrogen gas and nitrogen gas, the mixture ratio of the hydrogen gas or the nitrogen gas to the ammonia gas being set to be in a range of from 1:1 to 1:0.1 in terms of flow rate ratio.

27. A device according to claim 10, wherein said method not using metal organic compounds as raw materials comprises a DC magnetron sputtering method.

28. A device according to claim 10, wherein said substrate comprises a sapphire substrate and the first group III nitride compound semiconductor layer is formed on a face a of the sapphire substrate.

29. A device according to claim 11, wherein the first group III nitride compound semiconductor layer is formed in an atmosphere of a mixture gas comprising ammonia gas and at least one of hydrogen gas and nitrogen gas, the mixture ratio of the hydrogen gas or the nitrogen gas to the ammonia gas being set to be in a range of from 1:1 to 1:0.1 in terms of flow rate ratio.

30. A device according to claim 11, wherein said method not using metal organic compounds as raw materials comprises a DC magnetron sputtering method.

31. A device according to claim 11, wherein the first group III nitride compound semiconductor layer is formed on a face a of the sapphire substrate.

32. A device according to claim 15, wherein the first group III nitride compound semiconductor layer is formed in an atmosphere of a mixture gas comprising ammonia gas and at least one of hydrogen gas and nitrogen gas, the mixture ratio of the hydrogen gas or the nitrogen gas to the ammonia gas being set to be in a range of from 1:1 to 1:01 in terms of flow rate ratio.

33. A device according to claim 15, wherein said method not using metal organic compounds as raw materials comprises a DC magnetron sputtering method.

34. A device according to claim 15, wherein said substrate comprises a sapphire substrate and the first group III nitride compound semiconductor layer is formed on a face a of the sapphire substrate.

35. A device according to claim 22, wherein the first layer is formed in an atmosphere of a mixture gas comprising ammonia gas and at least one of hydrogen gas and nitrogen gas, the mixture ratio of the hydrogen gas or the nitrogen gas to the ammonia gas being set to be in a range of from 1:1 to 1:0.1 in terms of flow rate ratio.

36. A device according to claim 22, wherein said first layer is formed on said substrate by a DC magnetron sputtering method.

37. A device according to claim 22, wherein said substrate comprises a sapphire substrate and the first group III nitride compound semiconductor layer is formed on a face a of the sapphire substrate.

* * * * *